United States Patent [19]

Akiba et al.

[11] Patent Number: 4,553,239
[45] Date of Patent: Nov. 12, 1985

[54] DISTRIBUTED FEEDBACK SEMICONDUCTOR LASER

[75] Inventors: Shigeyuki Akiba, Tokyo; Katsuyuki Utaka, Musashino; Kazuo Sakai, Tokyo; Yuichi Matsushima, Tokorozawa, all of Japan

[73] Assignee: Kokusai Denshin Denwa Kabushiki Kaisha, Tokyo, Japan

[21] Appl. No.: 464,889

[22] Filed: Feb. 8, 1983

[30] Foreign Application Priority Data

Feb. 16, 1982 [JP] Japan ................................ 57-22123

[51] Int. Cl.$^4$ .............................................. H01S 3/19
[52] U.S. Cl. ........................................ 372/50; 372/44; 372/96
[58] Field of Search ............................. 372/44, 50, 96

[56] References Cited

U.S. PATENT DOCUMENTS 4,045,749  8/1977  Burnham et al. ..................... 372/50
4,144,503  3/1979  Itoh et al. ............................. 372/45
4,309,667  1/1982  DiForte et al. ....................... 372/96

FOREIGN PATENT DOCUMENTS 1555350  11/1976  United Kingdom ................. 372/50

Primary Examiner—James W. Davie
Attorney, Agent, or Firm—Robert E. Burns; Emmanuel J. Lobato; Bruce L. Adams

[57] ABSTRACT

A distributed feedback semiconductor laser which has periodic corrugations on a light emitting layer or an adjoining layer in the direction of travel of light and performs laser oscillation by the injection of current into the light emitting layer. In accordance with the present invention, a semiconductor having an energy gap larger than that of light emitting layer is formed so as to be extended from a current injection region. The semiconductor is formed uniformly and sufficiently distributed in the current injection region.

4 Claims, 5 Drawing Figures

DISTRIBUTED FEEDBACK SEMICONDUCTOR LASER

BACKGROUND OF THE INVENTION

The present invention relates to an improvement of the characteristic of a distributed feedback semiconductor laser (hereinafter referred to simply as "DFB laser").

The DFB laser has the construction which has, in a light emitting layer or an adjoining layer, periodic corrugations serving as a diffraction grating to thereby equivalently introduce periodic refractive index variations in the layer.

Such a conventional laser has a distorted output during modulation or undesirable influence on a single wavelength operation.

SUMMARY OF THE INVENTION

An object of the present invention is to provide a laser of good linearity which is free from such defects of the prior art.

To attain the above object of the present invention, there is provided a distributed feedback seminconductor laser which has periodic corrugations on a light emitting layer or an adjoining layer in the direction of travel of light and performs laser oscillation by the injection of current into the light emitting layer, characterized in that a semiconductor having an energy gap larger than that of said light emitting layer is formed so as to be extended from a current injection region, the semiconductor being formed uniformly and sufficiently thicker than a width across which light is essentially distributed in the current injection region.

BRIEF DESCRIPTION OF THE DRAWINGS

The present invention will be described in details below in comparison with convention arts with reference to the accompanying drawings, in which.

DESCRIPTION OF THE PREFERRED EMBODIMENTS

To make difference between prior arts and the present invention clear, an example of prior arts will first be described.

Figure 1:
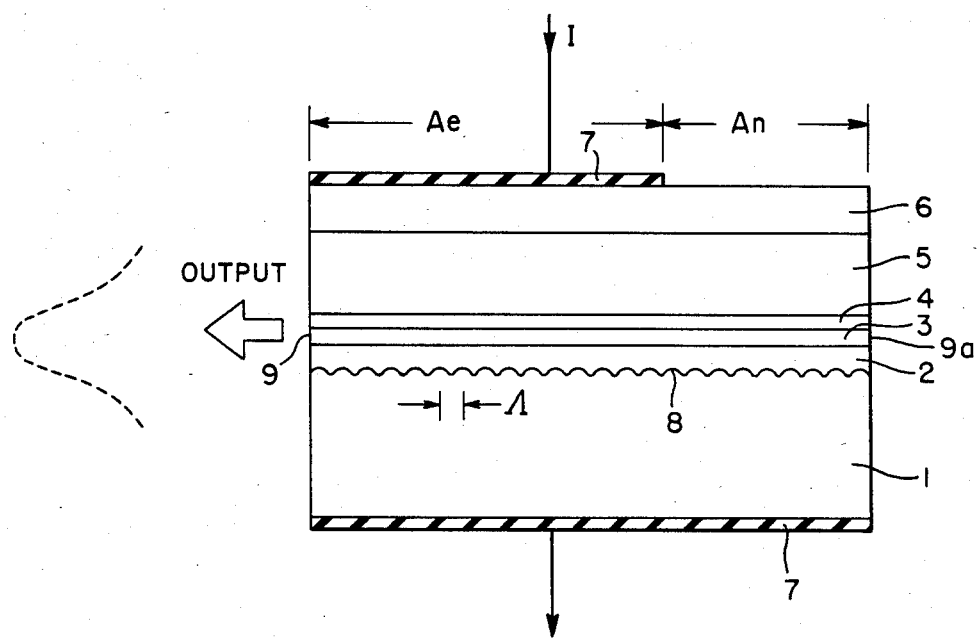
FIG. 1 is a cross-sectional view of a conventional distributed feedback laser provided with an excitation region and an absorption region (a non-excitation region)

With reference to FIG. 1 showing a prior art example of the DFB laser using a mixed crystal semiconductor of $In_{1-x}Ga_xAs_yP_{1-y}$ systems, reference numeral 1 indicates an n-type InP substrate; 2 designated an n-type InGaAsP waveguide layer; 3 identifies an InGaAsP light emitting layer; 4 denotes an InGaAsP buffer layer for preventing a meltback of the light emitting layer; 5 represents a p-type InP layer; 6 shows a p-type InGaAsP layer; 7 refers to electrodes; 8 signifies a periodic structure composed of periodic corrugations; and 9 and 9a indicate light emitting end faces. With such a structure, when a current is applied across the electrodes 7, an oscillation is obtained which has such distribution of light centering about the light emitting layer 3 as shown. The region in which the light is essentially distributed will hereinafter be referred to as the laser region. Furthermore, in such a DFB laser, a non-excitation region into which no current is injected is provided as shown so as to suppress an oscillation by a Fabry-Perot (hereinafter referred to simply as F-P) resonator which is formed by the two end faces 9 and 9a. With such an arrangement, it is possible to obtain only an oscillation by the periodic structure 8, permitting a stable operation at a single wavelength which is determined by the period A of the corrugations of the periodic structure 8.

Figure 2:
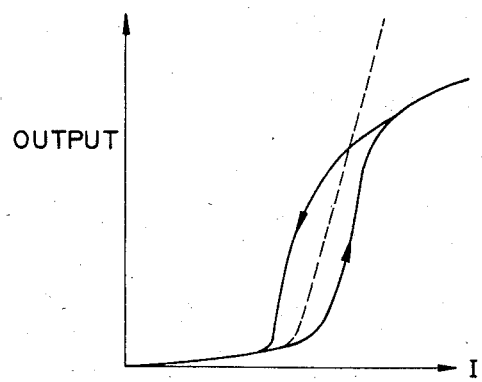
FIG. 2 is a graph explanatory of the input-output characteristics of the conventional laser and this invention laser.

In such a laser as shown in FIG. 1, however, since the non-excitation region acts as a saturable light absorber, there are cases where a saturation phenomenon occurs in its output-current characteristic or the output in the case of the current being increased and the output in the case of the current being decreased differ from each other as shown in FIG. 2. This often results in a distorted output during modulation or undesirable influence on a single wavelength operation.

The present invention will hereinafter be described in detail.

Figure 3:
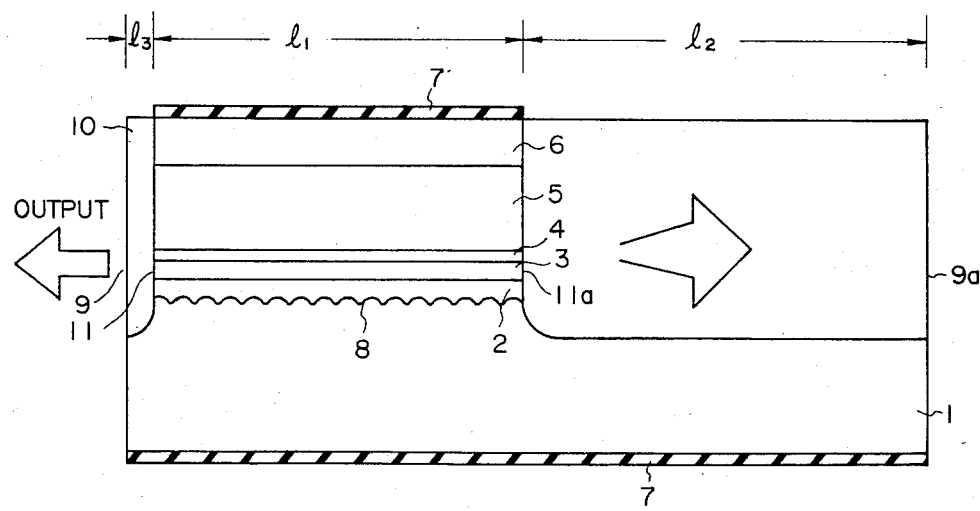
FIG. 3 is a side view illustrating an embodiment of the present invention.

FIG. 3 illustrates an embodiment of the present invention, in which InP layers 10 and 10a are buried so a to be extended from end portions 11 and 11a of the laser region of length $l_1$. In this case, $l_3$ may also be zero. The substrate 1 has in the length $l_2$ a thickness less than that in the length $l_1$. With the illustrated structure, light emitted from the end portion 11a is widespread in the InP layer 10a of a length $l_2$, and the ratio in which the light is reflected by the light emitting end face 9a back to the laser region is very low. Accordingly, the F-P resonator constituted by the light emitting end faces 9 and 9a has a large loss and its oscillation is suppressed, permitting the single wavelength operation inherent in the DFB laser. On the other hand, since the InP layer 10 is transparent to the output light, there does not occur such a disadvantage as indicated by the solid line in FIG. 2, ensuring provision of an input-output characteristic of good linearity as indicated by the broken line.

Figure 4A:
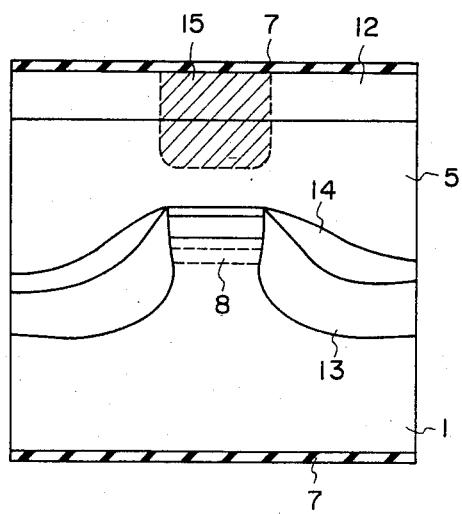
FIGS. 4A and 4B are a front view and a side view illustrating another embodiment of the present invention as being applied to a buried stripe structure.
Figure 4B:
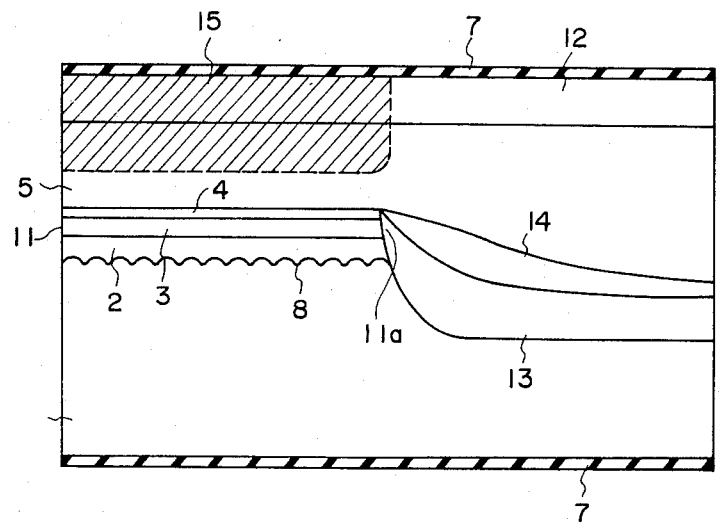

FIGS. 4A and 4B illustrate another embodiment of the present stabilization of the lateral mode, FIG. 4A being a front view and FIG. 4B a side view. In FIGS. 4A and 4B, the parts corresponding to those in FIG. 3 are identified by the same reference numerals. In this embodiment, the buried portion is composed of a p-type InP layer 13, an n-type InP layer 14, a p-type InP layer 5 and an n-type InGaAsP uppermost layer 12, providing a layer structure which blocks current in this buried portion. On the other hand, a current is injected into the light emitting layer 3 through a Zn diffused region 15. Furthermore, in this example, the InP is buried so as to be extended from only the one end portion 11a of the light emitting layer 3, and the output is emitted directly from the other end face 11.

As has been described in the foregoing, the distributed feedback semiconductor laser of the present invention sufficiently suppresses the F-P oscillation and permits the single wavelength operation and, at the same time, possesses an excellent output-current characteristic of good linearity. As regards the stripe structure for stabilization of the lateral mode, the present invention is applicable to many lateral mode stabilized lasers including the buried stripe structure shown in FIG. 4. Moreover, the semiconductor materials for use with the present invention may also be mixed crystal semiconductors as of AlGaAs systems other than those of InGaAsP systems.

Thus the present invention provides a semiconductor laser which performs a stable single wavelength operation and has an excellent input-output characteristic, and hence it is of great utility when employed for optical information processing.

What we claim is:

1. In a distributed feedback semiconductor laser comprising a substrate, a distributed light region, having a light emitting layer, an adjoining layer and corrugations causing refractive index variations in the travelling direction of light, and electrodes on the distributed light region for injection of a current into the light emitting layer thereby causing laser oscillation, the improvement characterized in that a semiconductor region having an energy gap larger than an energy gap of said light emitting layer is defined as at least one layer of an end extension of the distributed light region, said substrate having in the semiconductor region a thickness less than that in the distributed light region, and the semiconductor region being uniformly and substantially thicker than a width dimension of said distributed light region and effective to widespread therein light received from the distributed light region and to maintain from feeding back of the light to the distributed light region.

2. A distributed feedback semiconductor laser according to claim 1 in which the semiconductor region is a single layer of InP.

3. A distributed feedback semiconductor laser according to claim 1, in which the semiconductor region is comprised of a p-type InP layer, an n-type InP layer and a p-type InP.

4. A distributed feedback semiconductor laser according to claim 1, in which the semiconductor region has an uppermost cap layer.

* * * * *